Dec. 29, 1964 J. M. BARRINGER 3,163,781
ISOLATING AND FREQUENCY MULTIPLYING CIRCUIT EMPLOYING VARACTOR DIODES
Filed Nov. 29, 1962
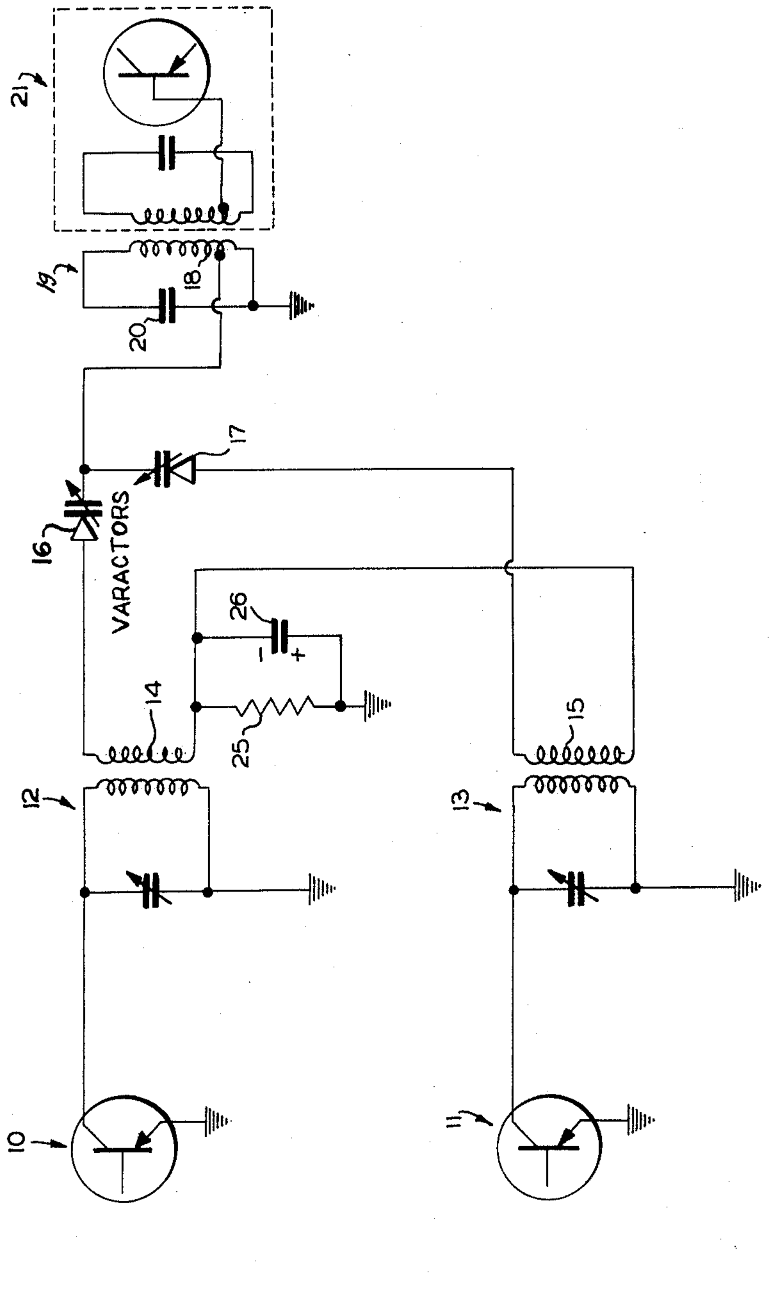
INVENTOR
GERRY M. BARRINGER
BY J. David Blumenfeld
ATTORNEY

United States Patent Office 3,163,781
Patented Dec. 29, 1964

3,163,781

ISOLATING AND FREQUENCY MULTIPLYING CIRCUIT EMPLOYING VARACTOR DIODES

Jerry Monroe Barringer, Lynchburg, Va., assignor to General Electric Company, a corporation of New York Filed Nov. 29, 1962, Ser. No. 240,921
5 Claims. (Cl. 307—88.5)

This invention relates to an isolating and frequency multiplying circuit and more particularly to a coupling circuit therefor employing solid state non-linear reactance devices.

Frequently, there is a need for a system in which two or more oscillators or amplifiers may be efficiently coupled into the same output circuit, such as a mixer. In addition, it is often desirable to provide for frequency multiplication of the input or driving signal frequency. Since each input circuit may be resonant at a different frequency, the output circuit must be tunable or resonant over a broad range of frequencies. In such circuit arrangements, the impedance of one oscillator reflects into the circuit of one or more of the other oscillators resulting in undesirable loading or interaction.

In some prior art circuit arrangements, this difficulty has been circumvented by providing separate output or mixer circuits individually coupled to each oscillator circuit. However, the use of separate output circuits individually coupled to each input circuit results in increased cost of manufacture and additional undesirable power requirements.

In order to overcome these limitations, it has been proposed to utilize non-linear reactance elements to couple each oscillator to the output of utilization circuit. Frequency multiplication is achieved by virtue of the non-linear reactance characteristics of the elements, while biasing the non-linear elements in a prescribed manner to provide the necessary isolation between oscillators. The non-linear reactance elements which have been proposed for this purpose are solid state voltage-sensitive semiconductor capacitance elements which are customarily referred to as varactors.

In prior art arrangements, it has always been considered highly undesirable to operate a varactor in a forward conduction region, i.e., in a region where the PN junction is even slightly forward biased, because it was thought that operation in the forward conduction region introduced non-linear resistance losses. It has been found, however, that it is possible to work slightly into the forward conduction region and thereby take full advantage of the large rate of change of capacitance with voltage while yet limiting the forward conduction angle sufficiently so as not to introduce substantial non-linear resistance effects. That is, the non-linear reactance is operated with a forward conduction angle such as to enhance the Q or quality factor of the varactor diode, i.e., the region of greatest capacitance change with voltage, while yet minimizing any non-linear resistance effects. A system using a single non-linear reactance element of the varactor type wherein the varactor is operated with a small forward conduction angle to take advantage of the non-linear reactance characteristic of the varactor to achieve frequency multiplication is described in pending application Serial No. 127,694, filed July 28, 1961, in the name of Junior I. Rhodes, and assigned to the assignee of the present invention.

Accordingly, it is an object of this invention to provide an improved isolating and frequency multiplying circuit wherein more than one input circuit is coupled into a single output circuit.

A further object of this invention is to provide an improved isolating and frequency multiplying circuit arrangement utilizing non-linear reactance elements both as multiplying and as isolating devices.

With the above objects in mind, the present invention comprises, in one form thereof, an isolating and multiplying circuit utilizing non-linear reactance elements of the PN junction type. The circuit arrangement incorporating the non-linear reactance elements includes at least a pair of input circuits individually resonant at a separate input frequency, an output or utilization circuit selectively resonant to a harmonic of the operating input frequency and at least a pair of varactor diodes for individually coupling each input circuit to the output circuit. An R-C self-biasing circuit is coupled to the varactors to develop a varying bias voltage in response to the input driving signal. A bias voltage level is established by the driving signal from one of the input circuits and the rectified portion of the driving signal sets the operating point of the diode associated with the input-driving circuit for maximum harmonic production, while biasing the other diode strongly in the reverse direction thereby isolating the other input circuit.

While the specification concludes with claims particularly pointing out and distinctly claiming the subject matter regarding the invention, it is believed that the invention will best be understood from the following description taken in connection with the accompanying drawing.

The single figure illustrates schematically an isolating and multiplying circuit constructed in accordance with the principles of the invention wherein non-linear reactance elements of the varactor type are utilized.

Varactors are zero or reverse biased PN junctions characterized by the fact that a region depleted of mobile-charged carriers exists on either side of the junction. This region or layer, which is sometimes referred to as the "depletion layer," is bounded on either side by the P and N type materials. The PN junction, therefore, effectively constitutes a capacitance since it represents an insulator substantially free of charge carriers bounded by the conducting layers on either side. The width of the depletion layer, and hence the capacitance of the device, varies inversely with the applied voltage and the application of a sinusoidal signal of frequency F, cyclically varies the capacitance of the device. Since the capacitance of the device is non-linear, an output signal is produced which is enriched in harmonics of the applied signal.

The capacitance-voltage variation of a varactor is not a simple linear relationship, but is exponential in nature with the specific capacitance-voltage relationship being a function of the junction structure. Thus, for an abrupt PN junction, the capacitance varies essentially as $1/\sqrt{V}$ whereas for a graded PN junction the capacitance varies at $$1/\sqrt[3]{V}$$

The greatest capacitance variation, that is, the greatest rate of change of capacitance C with voltage V, occurs in the range from a few volts reverse bias to a few tenths of a volt of forward bias. When the varactor is strongly biased in the reverse bias direction, the rate change of capacitance with voltage is substantially less.

Presently available frequency multipliers have always applied a fixed biasing voltage to the varactor so that the operation was exclusively in a reverse biased region. The conversion efficiencies of such harmonic generators have, however, been relatively low, with efficiencies on the order of only several percent for second, third or fourth harmonics being common. This low conversion efficiency level can be traced to the fact that the rate of change of capacitance with voltage, i.e., the slope of the capacitance voltage curve, is relatively small when the varactor is biased in the reverse bias direction, and consequently, the non-linear effects are not very pronounced.

It has been found that a slight forward conduction angle may be most effectively maintained by utillizing a self-biasing arrangement wherein the input driving signal establishes a self-biasing voltage which continually adjusts itself to the proper level to produce the desired small forward conduction angle. This arrangement has many advantages. First, it eliminates the need for a fixed bias source, thereby reducing the complexity and cost of the circuit arrangement. Secondly, the system sensitivity to the variations in the biasing voltage source due to aging, etc., is reduced, thereby improving the overall stability of the system. Thirdly, the system automatically compensates for any variation in the input driving signal amplitude, since any changes in the amplitude will produce a corresponding change in the self bias so that the system always maintains itself at the proper level. This latter feature provides an additional advantage in that it now becomes possible to use this frequency-multiplying arrangement directly with amplitude-modulated signals. As the amplitude-modulated envelope of the driving signal changes, the self-biasing level for the reactor changes correspondingly, and the system always maintains the proper biasing level for optimum performance so that an amplitude-modulated signal at the harmonic of the input carrier frequency is reproduced at the output of the system. Fourthly, when coupling two oscillators to a single output or utilization circuit, operation of one of the oscillators serves to reverse bias the non-linear element associated with the other oscillator sufficiently to provide the needed isolation between the two oscillators.

Each of the oscillators 10 and 11 in the sole figure may be crystal oscillators or any other source which generates a sinusoidal carrier or input driving signal of frequency $F_1$ and $F_2$ respectively, or may be a source of amplitude or frequency modulated signals. The input driving signal is developed in the parallel resonant L-C circuits 12, 13 of oscillators 10, 11 respectively. The parallel L-C circuits are resonant at the fundamental input driving frequency of $F_1$ and $F_2$ respectively. The resonant circuits 12, 13 are inductively coupled to output windings 14 and 15 respectively. Frequency multiplying and isolating semiconductor reactance elements 16 and 17, which may be, for example, varactors, are coupled to the windings and their capacitance varies in response to the variations of the driving signals to generate various harmonics of the input signal. The cathode junctions of elements 16 and 17 are tied together and connected to the low impedance point of inductance 18 of the tuned L-C output circuit 19 which is resonant to the desired harmonic frequencies $NF_1$ or $NF_2$.

The L-C tank circuit 19 is tunable by variable capacitor 20 to provide a sufficiently wide pass band to handle multiples of the input frequency from oscillator 10 as well as multiples of the input frequency from oscillator 11, i.e., $NF_1$ and $NF_2$. Circuit 19 may be inductively coupled to another resonant circuit, such as a mixer circuit, in a manner well known in the art, or any other suitable output utilization circuit, indicated generally at 21, which utilizes the harmonic signal generated by the harmonic-enriching circuit.

A self-biasing circuit is provided for establishing the desired bias on varactors 16, 17. The self-biasing circuit comprises a resistance 25 and a shunt capacitance 26 and is coupled at one end to inductance 14 and 15, with with the other end of resistor 25 and capacitor 26 being tied to ground. The voltage drop across resistance 25 due to the input driving signal establishes, in conjunction with capacitance 26, a biasing voltage having a polarity indicated by the plus (+) and minus (−) signs. The polarity convention is used in a specialized sense in that the minus (−) sign represents a voltage which reverse biases the PN junction that the plus (+) sign represents a voltage which forward biases the PN junction. Since the isolating and multiplying circuit has no external bias source, the varactors are zero biased prior to application of the input signal.

Assuming a signal to be translated from oscillator 10, the first few cycles of the driving signal biases varactor 16 heavily into the forward conduction region during half cycles of the proper polarity, producing a large voltage drop across biasing resistor 25. This voltage drop charges capacitor 25 and establishes a reverse biasing voltage which causes the varactors 16, 17 to operate completely in a reverse biased region. During the time that the varactors are completely in the reverse biased region, the initial biasing voltage established across capacitor 26 decays as its charge slowly leaks off through resistance 25. This process continues until the biasing voltage reaches a proper level for the given driving signal amplitude to permit a slight angle of forward conduction.

The system automatically maintains this bias level in spite of changes in the driving signal. If the amplitude of the driving signal increases, the forward conduction angle also increases and the biasing voltage established across capacitance 26 is correspondingly increased, driving the varactors further into the reverse biased region and re-establishing the optimum forward conduction angle. If, on the other hand, the amplitude of the driving signal is reduced, the charge on capacitance 26 leaks off sufficiently to re-establish the proper biasing voltage. Thus, an automatic biasing point is established which is self-adjusting with variations in the driving signal amplitude or in response to the modulation envelope of an amplitude modulated signal.

The operation of the instant invention may be more fully comprehended by considering the following theory of operation. Before the application of a driving signal, the varactors 16, 17 are zero biased since no external biasing source is provided. Hence, the capacitance of the varactors is limited to their inherent capacity when operating with zero bias. A driving signal may be derived from either of the two input circuits. For purposes of explanation, it will be assumed that driving signal is obtained from oscillator 10, while oscillator 11 remains inactive. The driving signal of oscillator 10 is coupled through inductance 14 establishing a bias voltage across the self-biasing circuit comprising resistor 25 and capacitor 26 in a manner hereinbefore described, driving the varactor 16 into the heavily conducting region during signal alternations of one polarity. The current flow due to this conduction produces a voltage drop across the bias resistance, establishing a biasing voltage across the capacitor 26. The polarity of the voltage across this capacitor is such as to reverse bias the varactor 16. If the amplitude of the driving signal is such that the varactor 16 is reverse biased during both alternations of the driving signal, there is no further conduction and the capacitor discharges through the biasing resistor, thereby moving the bias towards the zero bias level.

This discharge continues until the desired biasing level is achieved at which point the driving voltage produces sufficient forward conduction to maintain the bias level. Varactor 17 is thus strongly reverse biased, reducing its capacitance and providing the required isolation.

Similarly, with oscillator 10 disabled and oscillator 11 energized, varactor 17 generates the desired harmonics while varactor 16 is reverse biased isolating oscillator 10 and preventing any interaction or loading with oscillator 11.

From the foregoing description, it is apparent that an isolating and multiplying circuit is obtained which will permit the coupling of two oscillators into a single output circuit. Isolation between the oscillators is achieved by coupling the oscillators to the common output circuit through individual varactor diodes which function both as frequency multipliers and isolating diodes. Operation of one of the oscillators together with a self-biasing arrangement reverse biases the diode associated with the other oscillator reducing its capacitance and thereby isolating that oscillator, while the diode associated with the driving oscillator couples the signal to the output circuit with a substantial enrichment of the harmonics of the fundamental operating frequency.

Although a particular embodiment of the subject invention has been described, many modifications may be made, and it is intended by the appended claims to cover all such modifications which fall within the true spirit and scope of the invention.

What is claimed as new and desired to be secured by Letters Patent is:

1. A frequency multiplying arrangement for multiplying the frequency of a selected one of a plurality of input signals while simultaneously preventing interaction between the activated multiplying circuit and the remaining nonactivated circuit means, the combination comprising:

(a) an input circuit arranged to have a first input from a first source of signals of frequency $F_1$ coupled thereto, (b) a second input circuit arranged to have an input from a second source of signals of frequency $F_2$ selectively coupled thereto, said input signals being applied to only one of the input circuits at a time, (c) a common output circuit selectively resonant at a harmonic of either of the input frequencies, (d) a first and a second non-linear reactance element for coupling respectively said first and second input circuits to said output circuit and for converting the frequency of the selectively provided input signals to a signal enriched in harmonic content, and (e) means for preventing interaction and loading of the input circuit having a signal impressed thereon by the other input circuit including means for establishing a bias voltage in response to an input signal impressed on one of the input circuits to bias the nonlinear element associated with the other input circuit to isolate the other of said input circuits while coupling said one of said input circuits to the output circuit.

2. A frequency multiplying arrangement for multiplying the frequency of a selected one of a plurality of input signals while simultaneously preventing interaction between the activated multiplying circuit and the remaining nonactivated circuit means, the combination comprising:

(a) a first input circuit arranged to have an input from a first source of signals of frequency $F_1$ coupled thereto, (b) a second input circuit arranged to have an input from a second source of signals of frequency $F_2$ selectively coupled thereto, said input signals being applied to only one of the input signals at a time, (c) a common output circuit selectively resonant at a harmonic of either of the input frequencies, (d) a first and a second non-linear reactance diode for coupling respectively said first and second input circuits to said output circuit and for converting the frequency of one of said first and second input signals to a signal enriched in harmonic content, and (e) means for preventing interaction and loading of the input circuit having a signal impressed thereon by the other input circuit including means for establishing a bias voltage for said first and second diodes in response to an input signal from said first input circuit whereby said second diode is biased to prevent interaction on said first input circuit from said second input circuit and said first diode operates in a region having large capacitance variations over a cycle of the input signal from said first input circuit.

3. A frequency multiplying arrangement for multiplying the frequency of a selected one of a plurality of input signals while simultaneously preventing interaction between the activated multiplying circuit and the remaining nonactivated circuit means, the combination comprising:

(a) a first input circuit arranged to have an input from a first source of signals of frequency $F_1$ selectively coupled thereto, (b) a second input circuit arranged to have an input from a second source of signals of frequency $F_2$ selectively coupled thereto, said input signals being applied to only one of the input signals at a time, (c) a common output circuit selectively resonant at a harmonic of either of the input frequencies, (d) a first and a second non-linear reactance diode for coupling respectively said first and second input circuits to said output circuit and for converting the frequency of one of said first and second input signal to a signal enriched in harmonic content, and (e) means for preventing interaction and loading of the input circuit having a signal impressed thereon by the other input circuit including means for establishing a bias voltage for said first and second diodes in response to an input signal impressed on one of said input circuits, said first diode having a slight forward bias in response to an input signal from said first input circuit whereby said first diode operates in a region having large capacitance variations over a cycle of the input signal from said first input circuit, and said second diode having the bias voltage impressed thereon to apply a substantial reverse bias in response to an input signal from said first input circuit to thereby prevent interaction of one input circuit on the other.

4. A frequency multiplying arrangement for multiplying the frequency of a selected one of a plurality of input signals while simultaneously preventing interaction between the activated multiplying circuit and the remaining nonactivated circuit means, the combination comprising:

(a) a first input circuit arranged to have a first input signal of frequency $F_1$ coupled thereto, (b) a second input circuit arranged to have a second input signal of frequency $F_2$ coupled thereto, said input signals being applied to only one of the input circuits at a time, (c) a common output circuit selectively resonant at a harmonic of either of the input frequencies, (d) a first and second non-linear reactance diode for coupling respectively said first and second input circuits to said output circuit and for converting the frequency of one of said first and second input signals to a signal enriched in harmonic content, and (e) an R-C self-biasing circuit coupled to said non-linear reactance diodes and said input circuits for producing a biasing voltage for said diodes in response to an input signal from one of said input circuits, said biasing voltage being applied to the diode associated with the other input circuit and having a polarity such that the diode is substantially reverse-biased to thereby isolate the other of said input circuits while coupling said one of said input circuits to the output circuit.

5. A frequency multiplying arrangement for multiplying the frequency of a selected one of a plurality of input signals while simultaneously preventing interaction between the activated multiplying circuit and the remaining nonactivated circuit means, the combination comprising:

(a) a first input circuit arranged to have a first input signal of frequency $F_1$ coupled thereto, (b) a second input circuit arranged to have a second input signal of frequency $F_2$ coupled thereto, said input signals being applied to only one of the input circuits at a given time, (c) a common output circuit selectively resonant at a harmonic of either of the input frequencies, (d) a first and a second non-linear reactance diode for coupling respectively said first and second input circuits to said output circuit and for converting the frequency of said first and second input signal to a signal enriched in harmonic content, and (e) self-biasing means responsive to an input signal from one of said input circuits for producing a biasing voltage for said first and second diodes, the polarity and magnitude of said biasing voltage being such that said biasing voltage and said input signal to said first diode produces a slight forward bias to thereby maintain a slight forward conduction angle even with variations of drive signal level, and said second diode is substantially reverse-biased to thereby isolate the input circuit which does not have an input signal impressed thereon from the remaining input circuit.

References Cited by the Examiner

UNITED STATES PATENTS

| | | | |
|---|---|---|---|
| 2,932,794 | 4/60 | Crow | 328—156 |
| 3,060,364 | 10/62 | Holcomb | 307—88.5 X |
| 3,076,133 | 1/63 | Holcomb | 328—16 X |
| 3,085,205 | 4/63 | Sante | 328—16 |

ARTHUR GAUSS, *Primary Examiner.*